(12) United States Patent
Citta et al.

(10) Patent No.: US 6,980,059 B2
(45) Date of Patent: Dec. 27, 2005

(54) DATA DIRECTED FREQUENCY ACQUISITION LOOP THAT SYNCHRONIZES TO A RECEIVED SIGNAL BY USING THE REDUNDANCY OF THE DATA IN THE FREQUENCY DOMAIN

(75) Inventors: Richard W Citta, Oak Park, IL (US); Scott M LoPresto, Mount Prospect, IL (US); Jingsong Xia, Mundelein, IL (US); Wenjun Zhang, Shanghai (CN)

(73) Assignee: Micronas Semiconductors, Inc., Palatine, IL (US)

( * ) Notice: Subject to any disclaimer, the term of this patent is extended or adjusted under 35 U.S.C. 154(b) by 19 days.

(21) Appl. No.: 10/404,516

(22) Filed: Apr. 1, 2003

(65) Prior Publication Data

US 2003/0214350 A1 Nov. 20, 2003

Related U.S. Application Data (60) Provisional application No. 60/370,295, filed on Apr. 5, 2002, provisional application No. 60/370,283, filed on Apr. 5, 2002, and provisional application No. 60/370,296, filed on Apr. 5, 2002.

(51) Int. Cl.[7] .................................................. H03L 7/00
(52) U.S. Cl. .......................... 331/12; 331/1 A; 329/308
(58) Field of Search ........................... 331/12, 11, 1 A; 329/308, 360, 325

(56) References Cited

U.S. PATENT DOCUMENTS

| | | |
|---|---|---|
| 4,567,599 A | 1/1986 | Mizoguchi |
| 4,712,221 A | 12/1987 | Pearce et al. |
| 4,815,103 A | 3/1989 | Cupo et al. |
| 4,833,693 A | 5/1989 | Eyuboglu |
| 4,856,031 A | 8/1989 | Goldstein |
| 4,866,395 A | 9/1989 | Hostetter |

(Continued)

FOREIGN PATENT DOCUMENTS

| | | |
|---|---|---|
| EP | 0524559 B1 | 5/1997 |
| EP | 0752185 B1 | 7/2002 |
| WO | WO 00/27033 | 5/2000 |
| WO | WO 00/27066 | 5/2000 |
| WO | WO 01/01650 A1 | 1/2001 |
| WO | WO 01/13516 A2 | 2/2001 |
| WO | WO 01/43310 A2 | 6/2001 |
| WO | WO 01/43384 A2 | 6/2001 |

OTHER PUBLICATIONS

Demodulation of Cochannel QAM Signals (continued); Error Detection/Correction; pp. 1–3, http://www.appsig.com/papers/1813f/813f_4.html.

Demodulation of Cochannel QAM Signals (continued); Simulation Results; pp. 1–6; http://www.appsig.com/papers/1813f/813f_5.html.

*Primary Examiner*—Robert Pascal
*Assistant Examiner*—Joseph Chang
(74) *Attorney, Agent, or Firm*—O'Shea, Getz, & Kosakowski, P.C.

(57) ABSTRACT

A data-directed frequency-acquisition loop capable of generating a frequency error having a magnitude and direction from a double sideband suppressed signal comprises a first multiplier that multiplies the signal by the output of a VCO. The output of the first multiplier is convolved by a second multiplier. The I output of the second multiplier passes through a first low-pass filter. The filtered I output and the Q output are then multiplied by a third multiplier. The output of the third multiplier is filtered through a second low-pass filter, amplified, and return to the VCO to complete the feedback loop.

16 Claims, 7 Drawing Sheets

U.S. PATENT DOCUMENTS

| | | |
|---|---|---|
| 4,989,090 A | 1/1991 | Campbell et al. |
| 5,052,000 A | 9/1991 | Wang et al. |
| 5,056,117 A | 10/1991 | Gitlin et al. |
| 5,134,480 A | 7/1992 | Wang et al. |
| 5,210,774 A | 5/1993 | Abbiate et al. |
| 5,311,546 A | 5/1994 | Paik et al. |
| 5,453,797 A | 9/1995 | Nicolas et al. |
| 5,471,508 A | 11/1995 | Koslov |
| 5,506,636 A | 4/1996 | Patel et al. |
| 5,508,752 A | 4/1996 | Kim et al. |
| 5,532,750 A | 7/1996 | De Haan et al. |
| 5,537,435 A | 7/1996 | Carney et al. |
| 5,568,098 A | 10/1996 | Horie et al. |
| 5,568,521 A * | 10/1996 | Williams et al. ............ 375/344 |
| 5,588,025 A | 12/1996 | Strolle et al. |
| 5,619,154 A | 4/1997 | Strolle et al. |
| 5,648,987 A | 7/1997 | Yang et al. |
| 5,692,014 A * | 11/1997 | Basham et al. ............ 375/326 |
| 5,757,855 A | 5/1998 | Strolle et al. |
| 5,789,988 A | 8/1998 | Sasaki |
| 5,802,461 A | 9/1998 | Gatherer |
| 5,805,242 A | 9/1998 | Strolle et al. |
| 5,828,705 A * | 10/1998 | Kroeger et al. ............ 375/326 |
| 5,835,532 A | 11/1998 | Strolle et al. |
| 5,862,156 A | 1/1999 | Huszar et al. |
| 5,870,433 A | 2/1999 | Huber et al. |
| 5,872,817 A | 2/1999 | Wei |
| 5,894,334 A | 4/1999 | Strolle et al. |
| 5,995,154 A | 11/1999 | Heimburger |
| 6,005,640 A | 12/1999 | Strolle et al. |
| 6,034,734 A | 3/2000 | De Haan et al. |
| 6,034,998 A | 3/2000 | Takashi et al. |
| 6,044,083 A | 3/2000 | Citta et al. |
| 6,069,524 A | 5/2000 | Mycynek et al. |
| 6,133,785 A | 10/2000 | Bourdeau |
| 6,133,964 A | 10/2000 | Han |
| 6,145,114 A | 11/2000 | Crozier et al. |
| 6,154,487 A * | 11/2000 | Murai et al. ............ 375/150 |
| 6,178,209 B1 | 1/2001 | Hulyalkar et al. |
| 6,195,400 B1 | 2/2001 | Maeda |
| 6,198,777 B1 | 3/2001 | Feher |
| 6,219,379 B1 | 4/2001 | Ghosh |
| 6,222,891 B1 | 4/2001 | Liu et al. |
| 6,226,323 B1 | 5/2001 | Tan et al. |
| 6,233,286 B1 | 5/2001 | Wei |
| 6,249,544 B1 | 6/2001 | Azazzi et al. |
| 6,260,053 B1 | 7/2001 | Maulik et al. |
| 6,272,173 B1 | 8/2001 | Hatamian |
| 6,275,554 B1 | 8/2001 | Bouillet et al. |
| 6,278,736 B1 | 8/2001 | De Haan et al. |
| 6,304,614 B1 | 10/2001 | Abbaszadeh et al. |
| 6,307,901 B1 | 10/2001 | Yu et al. |
| 6,333,767 B1 | 12/2001 | Patel et al. |
| 6,356,586 B1 | 3/2002 | Krishnamoorthy et al. |
| 6,363,124 B1 | 3/2002 | Cochran |
| 6,411,341 B1 | 6/2002 | De Haan et al. |
| 6,411,659 B1 | 6/2002 | Liu et al. |
| 6,415,002 B1 | 7/2002 | Edwards et al. |
| 6,421,378 B1 | 7/2002 | Fukuoka et al. |
| 6,438,164 B2 | 8/2002 | Tan et al. |
| 6,452,639 B1 | 9/2002 | Wagner et al. |
| 6,466,630 B1 * | 10/2002 | Jensen ............ 375/327 |
| 6,490,007 B1 | 12/2002 | Bouillet et al. |
| 6,493,409 B1 | 12/2002 | Lin et al. |
| 6,507,626 B1 | 1/2003 | Limberg |
| 6,535,553 B1 | 3/2003 | Limberg et al. |
| 6,611,555 B2 | 8/2003 | Smith et al. |
| 6,734,920 B2 | 5/2004 | Ghosh et al. |
| 2001/0048723 A1 | 12/2001 | Oh |
| 2002/0024996 A1 | 2/2002 | Agazzi et al. |
| 2002/0136329 A1 | 9/2002 | Liu et al. |
| 2002/0154248 A1 | 10/2002 | Wittig et al. |
| 2002/0172275 A1 | 11/2002 | Birru |
| 2002/0172276 A1 | 11/2002 | Tan et al. |
| 2002/0186762 A1 | 12/2002 | Xia et al. |
| 2002/0191716 A1 | 12/2002 | Xia et al. |
| 2003/0058967 A1 | 3/2003 | Lin et al. |

\* cited by examiner

DATA DIRECTED FREQUENCY ACQUISITION LOOP THAT SYNCHRONIZES TO A RECEIVED SIGNAL BY USING THE REDUNDANCY OF THE DATA IN THE FREQUENCY DOMAIN

CLAIM OF PRIORITY

This utility patent application claims priority to U.S. Provisional Patent Applications Nos. 60/370,295, 60/370,283, and 60/370,296, all filed Apr. 5, 2002 the entire specifications of which are hereby incorporated herein.

BACKGROUND

In order to provide the widest possible coverage for a digital transmission, such as for cell phones or a digital television broadcast, it's desirable to use multiple transmitters that are separated from each other spatially. This permits a wider area to be covered, uses less total broadcast power, and can help to fill in dark areas where the transmission from one transmitter may be blocked. Thus, using multiple transmitters can provide wider and more complete coverage for virtually any digital transmission.

However, using multiple transmitters creates a serious problem when the receiver is at a "seam" between two transmitters, because the additional signal can appear as a "ghost" that can be as large as the "main" signal. Furthermore, destructive interference creates a series of perfect or near perfect nulls.

Existing receiver technology handles ghosts by filtering them out in order to interpret the "main" signal. But in a multi-transmitter environment this strategy is unworkable. It makes little sense to design a system to filter out a ghost that can be an arbitrarily large fraction of the "main" signal's size. Furthermore, near the margins the best this subtractive strategy can ever provide is a signal strength equal to the stronger transmitter's signal—the energy from the secondary signal is wasted.

Even when the ghosts are smaller than 100% of the "main" signal, there is an equal probability of pre- and post-ghosts. In the most common situation, the strongest signal is the one following the most direct path. Ghosts are most often produced by "multipathing," that is, by portions of the signal following paths of different lengths from the transmitter to the receiver. Thus, ghosts are typically produced by one or more strong reflections. The first signal to arrive is typically the most direct, and therefore the strongest, and so in the usual situation the ghost is a post-ghost. In a multi-transmitter environment, though, while the receiver is near a seam the stronger signal can easily arrive after the ghost. With signals arriving from two directions, it is possible that the more direct path may be the longer one. Consequently, pre-ghosts are about as likely as post-ghosts, and may be arbitrarily strong. Furthermore, if the transmitters are out of sync with each other by even a small amount, where the one lagging happens to be the closer one the receiver will likely see pre-ghosts.

Existing technology relies on the assumption that post-ghosts predominate (i.e., existing systems are not generally designed to deal with Raleigh fading). Thus, existing receivers generally will be either inefficient or incapable of dealing with a multi-transmitter environment, even if the ghosts are sufficiently small compared to the "main" signal.

In short, in a multi-transmitter environment, the "main" signal becomes a meaningless concept at the seams of the transmission. In order to operate efficiently in a multi-transmitter environment, a digital receiver must operate with a different paradigm. What is needed is a digital receiver that employs an additive strategy—that is, one in which the energy from one or more relatively large ghosts can be captured and used to aid in the synchronization process, rather than filtered out and discarded. Such a receiver could both function with ghosts 100% of the size of the "main" signal, and provides substantially superior performance whenever ghosts exceed about 70% of the size of the "main" signal.

From the receiver's perspective, most of the signal is useless for synchronization, because it is indistinguishable from white noise. The more information that is packed into a signal, the more closely it will resemble white noise, so this is both a desirable and inevitable feature of the signal. Nevertheless, some bandwidth must be "wasted" in order to provide the receiver a means to orient itself. Typically, one of two strategies is employed. In some systems, a pilot signal is included. This is a sharp peak of energy in a very narrow frequency band, which is very easy for the receiver to pick out.

Figure 1:
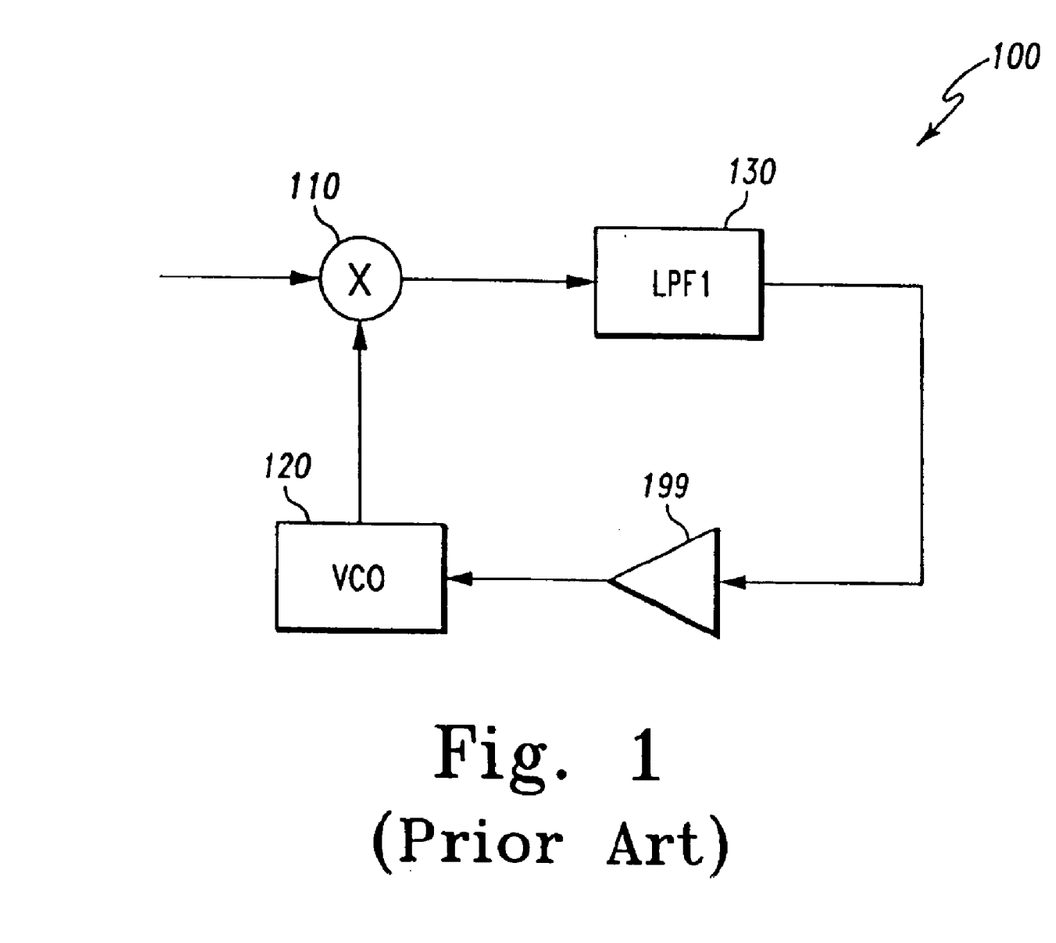
FIG. 1 is a prior art phase lock loop.

A phase-lock loop, such as the one shown in FIG. 1, indicated generally at 100, is a typical way to synch up a receiver using a pilot. A multiplier 110 multiplies the signal and the output of a voltage controlled oscillator 120 ("VCO") to produce a beat note (a sine wave with a frequency equal to the difference between the frequency of the pilot signal and the VCO's output). The beat note passes through a low-pass filter 130. The output of the filter 130 is amplified and input to the VCO 120 to complete the feedback loop. The low-pass filter 130 has competing design parameters. The more narrow the band pass of the filter 130 the smaller the response, so the slower the loop 100 is to lock up. However, a wide pass filter passes more noise and makes it harder for the loop 100 to capture at all.

It will be appreciated that the response of the loop 100 is driven by the frequency difference output of the first multiplier 110. The direction of error can only be determined by observing the slope of the time rate of change of the output. The second filter 130 distorts the sine wave, increasing the amplitude on the closer side, and decreasing it on the further side. Convergence is driven by this asymmetry of the distorted beat note.

However, because the amplitude of the beat note drops with increasing frequency difference, that distortion output drops as well, so the response of the phase-lock loop 100 decreases as the frequency of the VCO 120 diverges from the signal frequency. Thus, unless the signal happens to be close to the initial VCO 120 frequency, it will converge slowly, or not at all. A typical phase lock loop can capture when the initial VCO 120 frequency is within a factor of about 3–10 times the bandwidth of the loop.

Another, more robust, strategy for synching is to provide a signal in which information in the data is redundant in the frequency domain. The receiver can look for a correlation in the data created by this repetition to synch up. The receiver could use this same technique to find correlations in the data from signals from multiple transmitters. In mathematical terms, the correlation between the repeated signal portion can be identified by fully complex convolution. Convolution inherently corrects for the asymmetry produced by the slope of the Nyquist band, so that the peak value occurs when the limits of integration exactly correspond to the beginning and the end of the repeated data segment (and it's negative time image).

Figure 2:
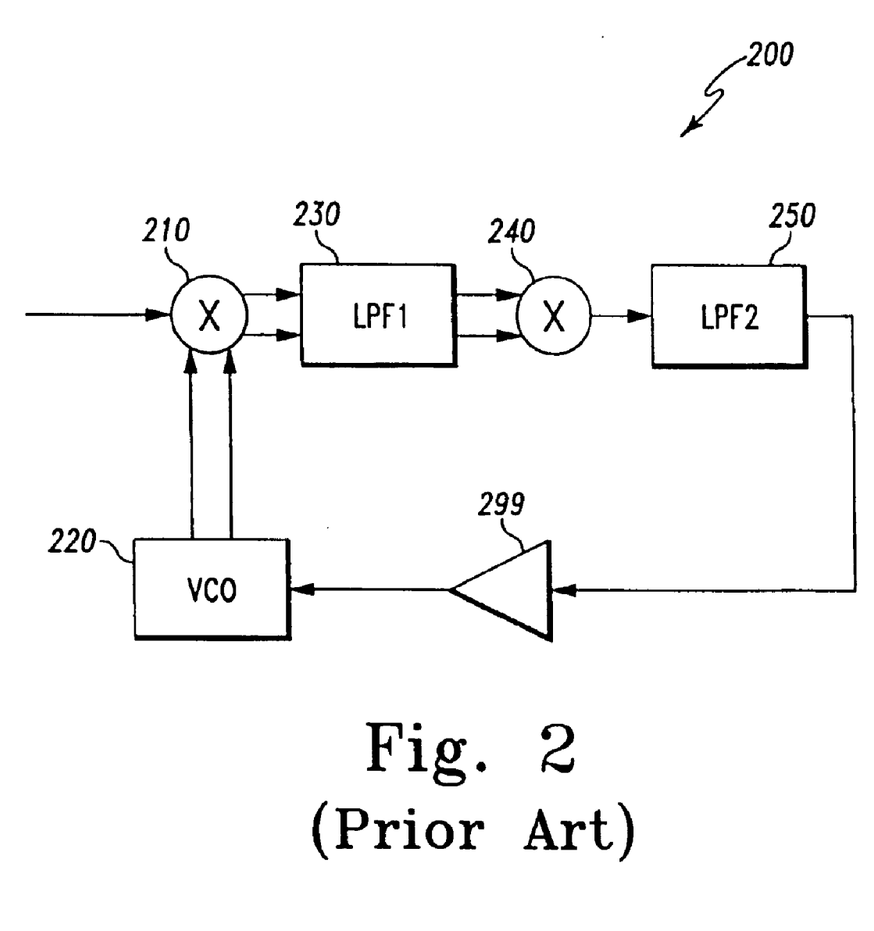
FIG. 2 is a prior art Costas loop.

A typical existing means for performing such a convolution is the Costas Loop, shown in FIG. 2. The Costas Loop operates on a complex signal, such as a QAM signal. As with the phase-lock loop, a first multiplier 210 multiplies the signal with the output of a VCO 220, though, as shown in FIG. 2, this is a complex multiplication, which produces both an I' and a Q' output. As with the phase-lock loop, the output of the first multiplier is passed through a low-pass filter 230 where the unwanted (frequency sum) portion of multiplied signal is removed. The in-phase and quadrature portions are then multiplied by a second multiplier 240 to produce a beat note (assuming the sideband isn't balanced—otherwise it's merely a DC voltage.) The beat note is passed through a second low-pass filter 250, then amplified at 299 and returned to the VCO 220 to complete the feedback loop. Thus, the portion of the Costas loop following the second multiplier 240, which drives the convergence of the loop, is basically a phase-lock loop. Consequently, like the phase-lock loop, the Costas loop has the disadvantage of slow convergence.

Figure 3:
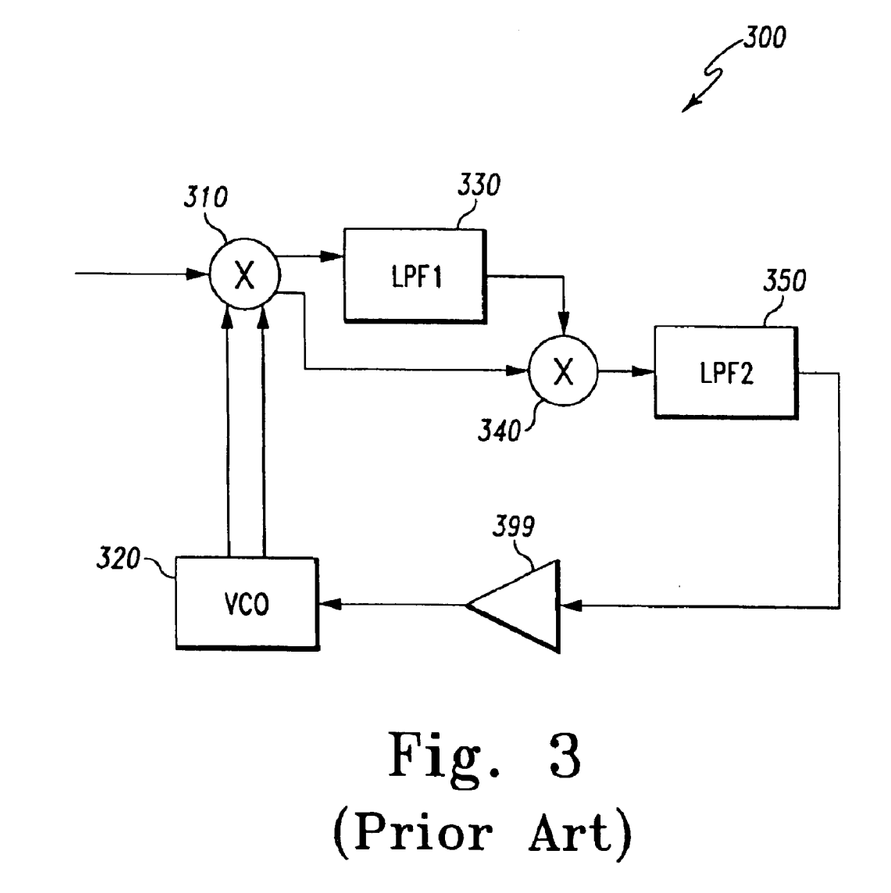
FIG. 3 is a prior art frequency-and-phase-lock loop.

A frequency-and-phase-lock loop ("FPLL") (shown in FIG. 3, and described in U.S. Pat. No. 4,072,909 to Citta, which is hereby incorporated by reference in its entirety) provides faster convergence. The FPLL has a first low-pass filter 330 and a second low-pass filter 350 which perform the function of the second low-pass filter 250 in the Costas loop, which separate the averaging and noise-elimination functions. Thus, the first low-pass filter 330 can have a relatively wide band pass, so that the FPLL can acquire even when the signal and initial VCO frequencies are off by as much as a factor of 1000. The second low-pass filter 350 can have a relatively narrow band-pass, in order to give good averaging during lock-up. The output of the second multiplier 340 is a rectified sine wave with a DC offset. The DC offset provides the direction information, rather than an integration of a distorted sine wave, which provides a much stronger response when the frequency difference is relatively large. The signal from the filter 350 is amplified at 399 and returned to the VCO 320 to complete the feedback loop.

Because of the way the FPLL uses the complex information to provide both magnitude and direction information, it locks up faster, and phase noise that is less than 90 degrees out of phase doesn't disrupt the lock. However, the FPLL does not perform a convolution of the data, and is therefore dependent upon a pilot to operate. It is therefore not suitable for use with, for example, a double sideband suppressed signal.

Because of the way the FPLL uses the complex information to provide both magnitude and direction information, it locks up faster, and phase noise that is less than 90 degrees out of phase doesn't disrupt the lock. However, the FPLL does not perform a convolution of the data, and is therefore dependent upon a pilot to operate. It is therefore not suitable for use with, for example, a double sideband suppressed signal.

Thus, what is needed is a new data-synch loop which combines the desired features of the Costas Loop—synching by finding a correlation in repeated data through convolution—with the desired faster convergence of a frequency-and-phase-lock loop.

SUMMARY OF THE INVENTION

A first embodiment data-directed frequency acquisition loop for synching to a signal comprises: a VCO, a first, second, and third multipliers, and a first and second low-pass filters. The VCO has an I and Q output. The first multiplier has as input the signal and the I and Q output, and has an I' and Q' output. The second multiplier has as input the I' and Q' output, and has an I" and Q" output. The first low-pass filter has as input the I" output, and has a filtered I" output. The third multiplier has as input the filtered I" output and the Q" output, and has a real output. The second low-pass filter has as input the real output, and has a feedback output that is input to the VCO.

A second embodiment data-directed frequency acquisition loop for synching to a signal comprises: a VCO, a first, second, third, fourth, fifth, and sixth multipliers, an amplifier, a summer, and first and second low-pass filters. The VCO has an I and Q output. The first multiplier receives the signal and the I output, and generates an I' component from them. The second multiplier receives the signal and the Q VCO output and generates a Q' component from them. The third multiplier receives the I' and Q' components and generates an I'Q' signal from them. The amplifier receives the I'Q' signal and generates a 2I'Q' signal from it. The fourth multiplier receives the I' component and generates an I'$^2$ signal from it. The fifth multiplier receives the Q' component and generates a Q'$^2$ signal from it. The summer receives the I'$^2$ and Q'$^2$ signals and generates a I'$^2$-Q'$^2$ signal. The first low pass filter receives the I'$^2$-Q'$^2$ signal and generates a filtered I'$^2$-Q'$^2$ signal. The sixth multiplier receives the 2I'Q' signal and the filtered I'$^2$-Q'$^2$ signal and generates a raw VCO driving signal from them. The second low pass filter receives the raw VCO driving signal, generates a filtered VCO driving signal from it, and sends the filtered VCO driving signal to the VCO.

A third embodiment frequency acquisition loop according to the present invention synchronizes with a signal using both a magnitude of error and a direction of error that are generated by convolving data in the signal.

In a fourth embodiment, a frequency acquisition loop according to the present invention has four points of stable equilibrium.

A fifth embodiment frequency acquisition loop according to the present invention comprises: a Costas loop, a sub-circuit, and a multiplier. The Costas loop has a VCO. The sub-circuit generates a difference of a square of an in-phase signal component and a square of a quadrature component. The multiplier changes the sign of a VCO driving voltage when the difference is less than zero.

In a sixth embodiment, a frequency acquisition loop according to the present invention comprises a frequency and phase-lock loop, and a complex multiplier that performs a fully-complex squaring operation.

In a seventh embodiment, a phase-lock loop according to the present invention provides frequency acquisition from correlation of the data.

In an eighth embodiment, a frequency acquisition and phase-lock loop according to the present invention provides frequency acquisition and phase lock derived from a signal's data.

A ninth embodiment synch loop for providing frequency acquisition and phase-lock loop for a double sideband suppressed carrier signal comprises a Costas loop and an in-phase loop. The Costas loop has a VCO. The in-phase loop generates $I^2-Q^2$, and includes a multiplier that changes the sign of a VCO driving voltage when $I^2-Q^2$ is less than zero. The frequency acquisition and phase-lock loop provides frequency acquisition and phase lock derived from the signal's data by generating both magnitude of error and a direction of error that are generated by convolving data in the signal. The synch loop has four points of stable equilibrium distributed 90 degrees from one another.

DETAILED DESCRIPTION OF THE PREFERRED EMBODIMENT

For the purposes of promoting an understanding of the principles of the invention, reference will now be made to the embodiment illustrated in the drawings and specific language will be used to describe the same. It will nevertheless be understood that no limitation of the scope of the invention is thereby intended, and alterations and modifications in the illustrated device, and further applications of the principles of the invention as illustrated therein, are herein contemplated as would normally occur to one skilled in the art to which the invention relates.

A data-directed frequency-acquisition loop ("DDFL") according to the present invention combines desirable features of a Costas loop and a frequency-and-phase-lock loop; the DDFL can synch using redundancy of the data in the frequency domain, such as in a double sideband suppressed signal, but has an output that converges like the FPLL, and that is not disrupted by noise that displaces the signal phase by 90 degrees or less.

Figure 4:
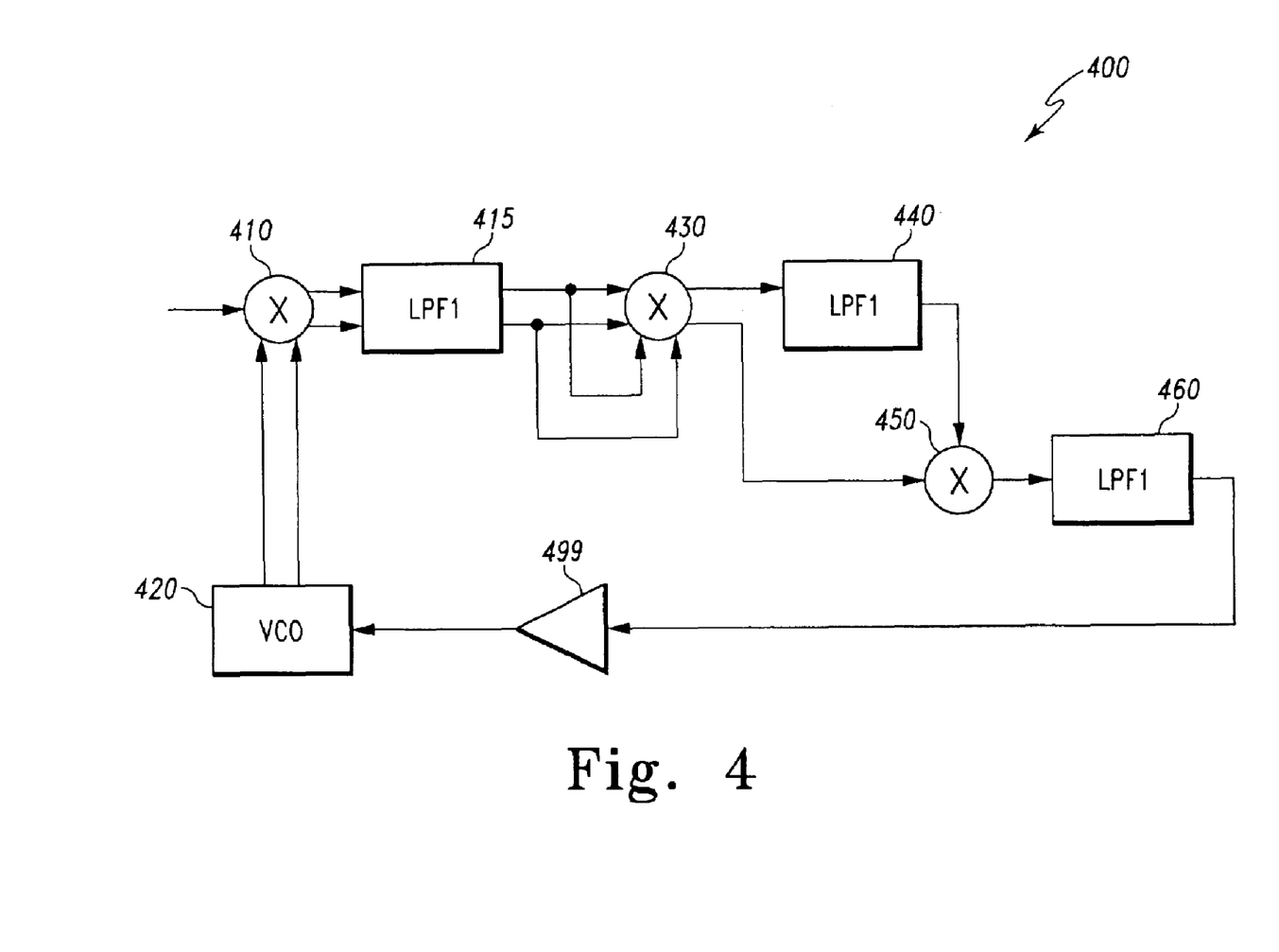
FIG. 4 is a preferred embodiment data-directed frequency-acquisition loop according to the present invention.

A preferred embodiment DDFL according to the present invention is shown in FIG. 4, and indicated generally at 400. The input signal and the output of a VCO 420, I and Q, are multiplied by a first complex multiplier 410 to produce I' and Q'. In the preferred embodiment, the I' and Q' output of the first complex multiplier 410 is then passed through an optional low-pass filter 415 to remove the unwanted products of the complex multiplication. The filtered I' and Q' output of the first complex multiplier 410 is then correlated by a second complex multiplier 430, to produce I" and Q". Note that because the correlation is being performed in the frequency domain it is a convolution of the signal. The I portion of the correlation (I") is equal to $I'^2 - Q'^2$; the Q portion (Q") is equal to $2I'Q'$. The I portion of the output is then passed through a first low-pass filter 440 with a phase shift characteristic shown in FIGS. 7A–C. The filtered I portion (in-phase portion) is then multiplied by the Q portion (quadrature-portion) of the correlation by a third multiplier 450. The output of the third multiplier 450 is then filtered by a second low-pass filter 460, amplified, and returned to the VCO 420 to complete the feedback loop.

Figure 7:
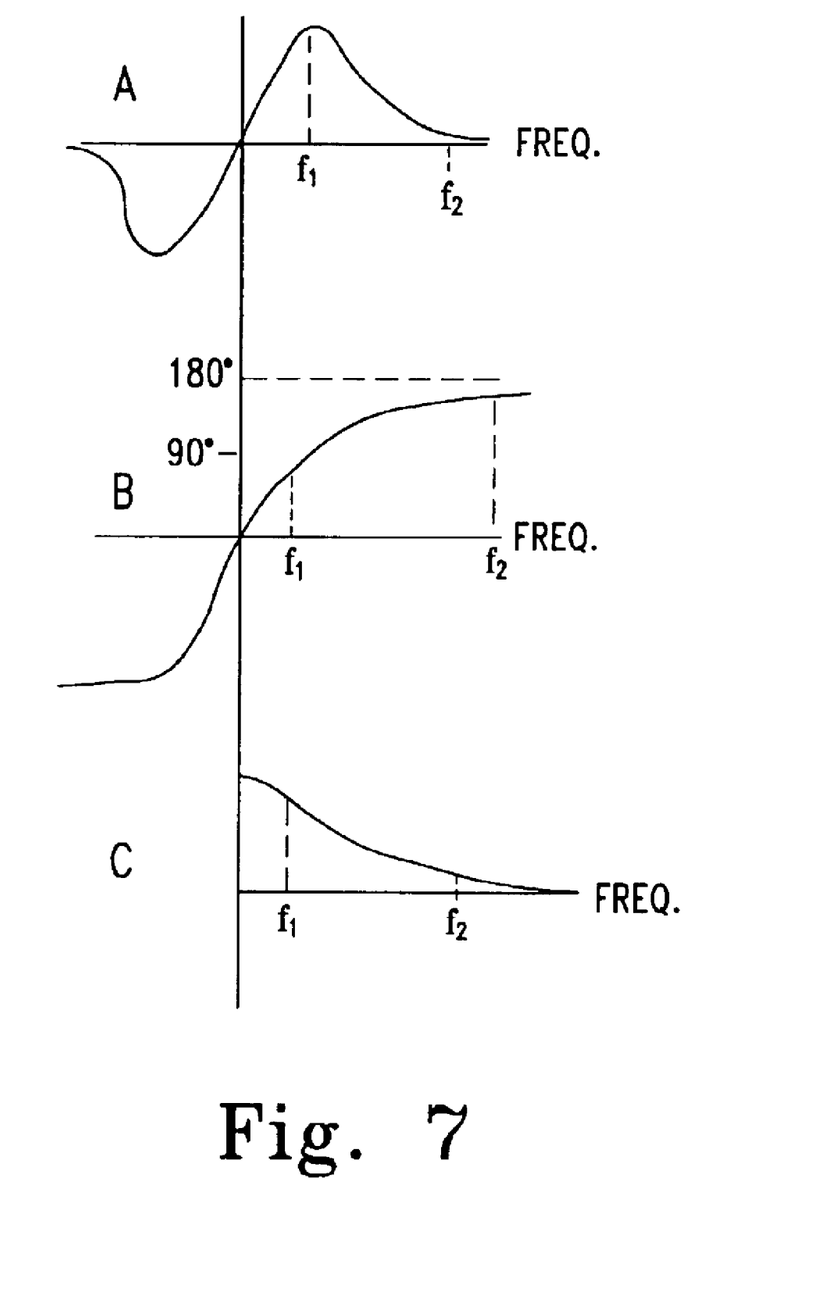
FIGS. 7A–C are graphs of the phase shift characteristic of a filter appropriate for use in a data-directed frequency acquisition loop according to the present invention.

Because the filter 440 has the amplitude and phase characteristics shown in FIGS. 7A and 7B, which result in the discriminator characteristic shown in FIG. 7C, having a positive slope at the zero intercept, the response circuit 400 provides a phase lock, as well as frequency acquisition, as discussed further hereinbelow.

It will be appreciated that the circuit can function under most conditions without the optional low-pass filter 415. However, in the preferred embodiment the optional low-pass filter 415 is included to eliminate the possibility of the multiplication of noise elements that might create a substantial error that either slows or prevents lock-up or causes a false lock.

It will be appreciated that the elements of the circuit shown in FIG. 4 can be substituted, permutated, or both, to produce a number of equivalent alternative embodiment circuits. In particular, the complex multipliers shown in FIG. 4 comprise a number of real multipliers organized to produce the complex product of QAM signals. The complex multipliers can be produced by a variety of sets and arrangements of subcomponents. Furthermore, the subcomponents can be reorganized or rearranged in a number of ways to produce the same mathematical result. Certain examples of such substitutions and rearrangements are described hereinbelow.

Figure 5:
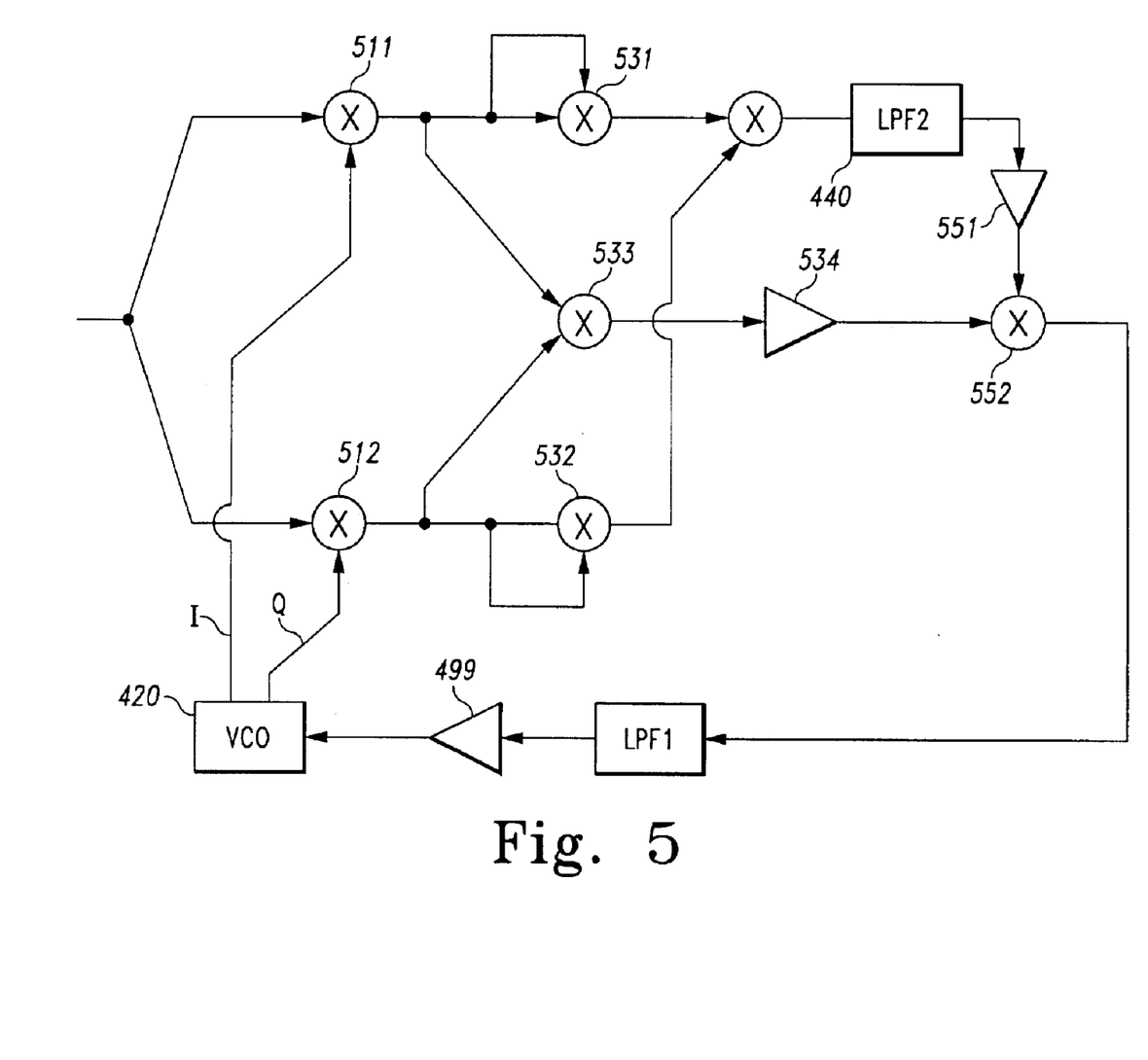
FIG. 5 is an alternative embodiment data-directed frequency-acquisition loop according to the present invention.

FIG. 5 is a block diagram of the preferred embodiment circuit shown in FIG. 4, showing further details of the complex multipliers used in certain embodiments, and having correspondingly numbered components. As can be seen in FIG. 5, the I signal is the product of the input signal and the I component from the VCO, while the Q signal is the product of the input signal and the Q component from the VCO. Thus, in the embodiment shown in FIG. 5 the first complex multiplier 410 comprises a pair of real multipliers 511 and 512. Similarly, the second complex multiplier 430 shown in FIG. 4 comprises a set of three real multipliers 531, 532, and 533, and the third complex multiplier 450 comprises a real multiplier 552 and an amplifier 551.

It will be appreciated that many of the real multipliers shown in FIGS. 4 and 5 can actually be substantially simpler hardware components. For example, the VCO can simply produce a signal of oscillating 1s and −1s. In this case, the potential multiplication required by the multipliers comprising the first complex multiplier 410 is limited to a change of signs. Similarly, the multipliers 531 and 532 multiply the same input by itself. Thus, the range of possible outputs contains only half the possibilities of the domain of inputs. Consequently, this function can more easily be performed by a lookup table that provides the square of the input than by an actual multiplier, which requires many more gates. The multiplier 533, however, must actually be a complete, real multiplier, since it has two independent and variable inputs (the I' signal and the Q' signal). The second complex multiplier 430 further comprises an amplifier 534 with a gain of 2 which follows the complete, real multiplier 533, because the correlation requires that the I portion and Q portion be normalized.

A number of alternative embodiments can likewise be formed by rearranging or substituting the elements of the third complex multiplier 430. In particular, the amplifier 551 can be a hard limiter, a soft limiter, or a linear amplifier. As described in further detail hereinbelow, the effect and function of the in-phase loop portion of the circuit 400 is to invert the signal during half of the phase cycle. Consequently, the amplifier 551 can simply be a hard limiter, and the real multiplier 552, like real multipliers 511 and 512, need only multiply by 1 and −1. The resulting output of the third complex multiplier 450, which drives the VCO, is shown by the solid curve in FIG. 6. For comparison, the response of a Costas Loop is also shown in FIG. 6 by the dotted curve.

It will be appreciated that the circuit 400 provides both frequency acquisition and phase lock. In FIG. 5, it can be seen that multipliers 511, 512, and 533 form a Costas loop. Thus, the circuit 400 comprises a Costas Loop combined with an in-phase loop, including the multipliers 531, 532, and 552, and the filter 440. If the in-phase component (I'-Q')

is greater than zero, then circuit will phase lock at 0 degrees or 180 degrees, identical to a Costas loop. But if the in-phase component is negative, the additional in-phase loop inverts the output of the Costas loop, resulting in two new stable equilibrium points at plus and minus 90 degrees.

Figure 6:
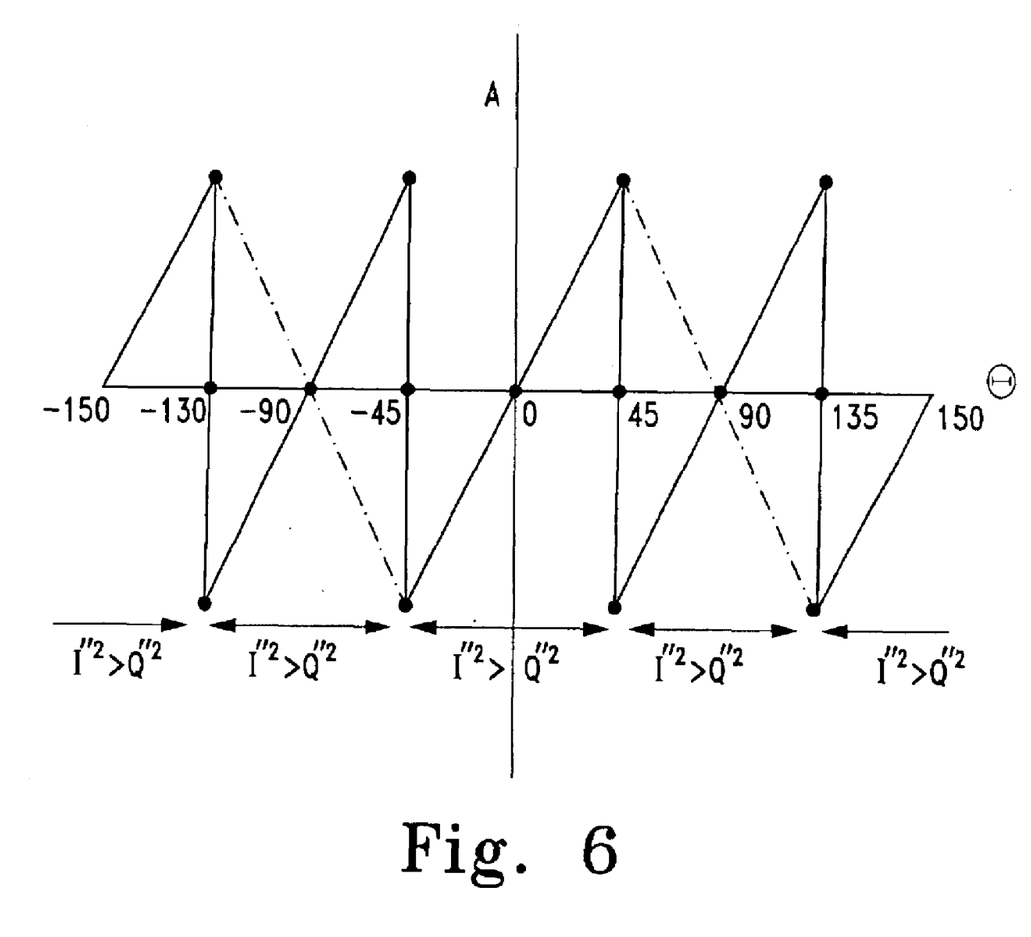
FIG. 6 is graph showing the response of a data-directed frequency-acquisition loop according to the present invention as a function of phase difference.

Consequently, the circuit 400 is a frequency acquisition loop that has four points of stable equilibrium, as shown in FIG. 6. It will be appreciated that a stable equilibrium point for the feedback loop occurs at each point where the curve describing the response crosses the x-axis with a positive, finite slope, since the voltage to the VCO will be positive when the phase is slightly to one side of the zero-intercept, and negative when slightly to the other side. This contrasts with the current produced, for example, by the Costas loop, shown as the dotted graph in FIG. 6. Because the Costas loop has a negative slope during half the cycle two of the finite-slope zero-intercepts are points of unstable equilibrium. When arbitrarily near one of these zeros the VCO will be driven in the wrong direction, causing a phase shift that will continue through 90 degrees, to the nearest point of stable equilibrium.

It will be appreciated that the inversion provided by the in-phase loop can be performed at other points in the circuit. For example, referring to FIG. 5, if the amplifier 551 is a hard limiter, the real multiplier 552 can be respositioned. In this case, the multiplier 552 is still driven by the output of the hard limiter 551. In some embodiments, the inversion has already been performed by the time the signal reaches the real multiplier 533, the output of the amplifier 534 is provided directly to the first low pass filter 460. In other embodiments, the amplifier 551 is a soft limiter. And, in still other embodiments, amplifier 511 is linear amplifier. (Note that in these embodiments the real multiplier 551 must be a full multiplier, since the potential multiplication is not limited to a sign change.) It will be appreciated that choosing a hard limiter, a soft limiter, or a linear amplifier has implications for the capture and noise-reduction capabilities of the loop 400. For example, a hard limiter is more susceptible to noise during capture, but once locked is more effective at holding the lock through noise.

While the invention has been illustrated and described in detail in the drawings and foregoing description, the same is to be considered as illustrative and not restrictive in character, it being understood that only the preferred embodiment, and certain other embodiments deemed helpful in further explaining how to make or use the preferred embodiment, have been shown. All changes and modifications that come within the spirit of the invention are desired to be protected.

We claim:

1. A data-directed frequency acquisition loop for synching to a signal, the data-directed frequency acquisition loop comprising:
    a VCO having an I and Q output;
    a first multiplier having as input the signal and the I and Q output, the first multiplier having an I' and Q' output;
    a second multiplier having as input the I' and Q' output and having an I" and Q" output;
    a first low-pass filter having as input the I" output and having a filtered I" output;
    a third multiplier having as input the filtered I" output and the Q" output and having a real output; and
    a second low-pass filter having as input the real output and having a feedback output that is input to the VCO.

2. The data-directed frequency acquisition loop of claim 1, wherein the second low-pass filter has a gain greater than 1.

3. The data-directed frequency acquisition loop of claim 1, further comprising an amplifier, and wherein the feedback output is passed through the amplifier before being input to the VCO.

4. The data-directed frequency acquisition loop of claim 1, further comprising a third low-pass filter, and wherein the I' and Q' output are passed through the third low-pass filter before being input to the second multiplier.

5. The data-directed frequency acquisition loop of claim 1, wherein the second multiplier is a squarer.

6. A data-directed frequency acquisition loop for synching to a signal, the data-directed frequency acquisition loop comprising:
    a VCO with an I and Q out put;
    a first multiplier that receives the signal and the I output and generates an I' component from them;
    a second multiplier that receives the signal and the Q VCO output and generates a Q' component from them;
    a third multiplier that receives the I' and Q' components and generates an I'Q' signal from them;
    an amplifier that receives the I'Q' signal and generates a 2I'Q' signal from it;
    a fourth multiplier that receives the I' component and generates an $I'^2$ signal from it;
    a fifth multiplier that receives the Q' component and generates a $Q'^2$ signal from it;
    a summer that receives the $I'^2$ and $Q'^2$ signals and generates a $I'^2$-$Q'^2$ signal;
    a first low pass filter that receives the $I'^2$-$Q'^2$ signal and generates a filtered $I'^2$-$Q'^2$ signal;
    a sixth multiplier that receives the 2I'Q' signal and the filtered $I'^2$ -$Q'^2$ signal and generates a raw VCO driving signal from them;
    a second low pass filter that receives the raw VCO driving signal, generates a filtered VCO driving signal from it, and sends the filtered VCO driving signal to the VCO.

7. The data-directed frequency acquisition loop of claim 6, wherein the first and second multipliers are limited to multiplying by 1 and −1.

8. The data-directed frequency acquisition loop of claim 6, wherein the fourth and fifth multipliers are look-up tables that give the square of the input.

9. The data-directed frequency acquisition loop of claim 6, further comprising a second amplifier positioned between the first low pass filter and the sixth multiplier.

10. The data-directed frequency acquisition loop of claim 9, wherein the second amplifier is a hard limiter.

11. A frequency acquisition loop that synchronizes with a signal using both a magnitude of error and a direction of error that are generated by convolving data in the signal, the frequency acquisition loop comprising:
    a Costas loop having a VCO;
    a sub-circuit that generates $I^2$-$Q^2$;
    a multiplier that changes the sign of a VCO driving voltage when $I^2$-$Q^2$ is less than zero.

12. A frequency acquisition loop comprising:
    a Costas loop having a VCO;
    a sub-circuit that generates a difference of a square of an in-phase signal component and a square of a quadrature component;
    a multiplier that changes the sign of a VCO driving voltage when the difference is less than zero.

13. The frequency acquisition loop of claim 12, wherein the multiplier does not change the magnitude of the voltage to the VCO when the difference is less than zero.

14. The frequency acquisition loop of claim 12, further comprising a complex multiplier that performs a fully-complex squaring operation.

15. A frequency acquisition and phase-lock loon that provides frequency acquisition and chase lock derived from a signal's data, the frequency acquisition and phase-lock loop comprising:

a Costas loop having a VCO;

a sub-circuit that generates a difference between an in-phase component squared and a quadrature component squared;

a multiplier that changes the sign of a VCO driving voltage when the difference between an in-phase component squared and a quadrature component squared is less than zero.

16. A synch loop for providing frequency acquisition and phase-lock loop for a double sideband suppressed carrier signal, the loop comprising:

a Costas loop having a VCO;

an in-phase loop that generates $I^2-Q^2$, the in-phase loop including a multiplier that changes the sign of a VCO driving voltage when $I^2-Q^2$ is less than zero;

wherein the frequency acquisition and phase-lock loop provides frequency acquisition and phase lock derived from the signal's data by generating both magnitude of error and a direction of error that are generated by convolving data in the signal; and wherein the synch loop has four points of stable equilibrium distributed 90 degrees from one another.

* * * * *

UNITED STATES PATENT AND TRADEMARK OFFICE
CERTIFICATE OF CORRECTION

PATENT NO. : 6,980,059 B2
DATED : December 27, 2005
INVENTOR(S) : Citta et al.

It is certified that error appears in the above-identified patent and that said Letters Patent is hereby corrected as shown below:

Column 3,
Lines 38-45, delete "Because of the way the FPLL uses the complex information to provide both magnitude and direction information, it locks up faster, and phase noise that is less than 90 degrees out of phase doesn't disrupt the lock. However, the FPLL does not perform a convolution of the data, and is therefore dependent upon a pilot to operate. It is therefore not suitable for use with, for example, a double sideband suppressed signal.".

Column 8,
Line 14, delete "out put" and insert -- output --.

Column 9,
Line 4, delete "loon" and insert -- loop --.
Line 5, delete "chase" and insert -- phase --.

Signed and Sealed this

Twenty-eighth Day of March, 2006

JON W. DUDAS
*Director of the United States Patent and Trademark Office*